US010211045B1

(12) United States Patent
Krishnan et al.

(10) Patent No.: US 10,211,045 B1
(45) Date of Patent: Feb. 19, 2019

(54) MICROWAVE ANNEALING OF FLOWABLE OXIDES WITH TRAP LAYERS

(71) Applicant: GLOBALFOUNDRIES INC., Grand Cayman (KY)

(72) Inventors: Rishikesh Krishnan, Cohoes, NY (US); Joseph K. Kassim, Menands, NY (US); Bharat V. Krishnan, Mechanicville, NY (US); Joseph F. Shepard, Jr., Poughkeepsie, NY (US); Rinus Tek Po Lee, Malta, NY (US); Yiheng Xu, Clifton Park, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/878,502

(22) Filed: Jan. 24, 2018

(51) Int. Cl.
*H01L 21/02* (2006.01)
*H01L 21/3105* (2006.01)
*H01L 29/06* (2006.01)
*H01L 21/762* (2006.01)
*H01L 27/088* (2006.01)

(52) U.S. Cl.
CPC .... *H01L 21/02271* (2013.01); *H01L 21/3105* (2013.01); *H01L 21/76224* (2013.01); *H01L 29/0653* (2013.01); *H01L 27/0886* (2013.01)

(58) Field of Classification Search
CPC .................. H01L 21/02271; H01L 21/02126
See application file for complete search history.

(56) References Cited

U.S. PATENT DOCUMENTS

| 9,184,089 B2 | 11/2015 | Tsai et al. |
| 2016/0013051 A1* | 1/2016 | Zeng ................... H01L 21/0206 257/368 |
| 2016/0194758 A1 | 7/2016 | Nemani et al. |
| 2018/0151564 A1* | 5/2018 | Lee .................. H01L 21/823481 |

* cited by examiner

*Primary Examiner* — Thomas L Dickey
(74) *Attorney, Agent, or Firm* — Gibb & Riley, LLC; Francois Pagette (57) ABSTRACT

An insulator is formed by flowable chemical vapor deposition (FCVD) process. The insulator is cured by exposing the insulator to ultraviolet light while flowing ozone over the insulator to produce a cured insulator. The curing process forms nitrogen, hydrogen, nitrogen monohydride, or hydroxyl-rich atomic clusters in the insulator. Following the curing process, these methods select wavelengths of microwave radiation (that will be subsequently used during annealing) so that such wavelengths excite the nitrogen, hydrogen, nitrogen monohydride, or hydroxyl-rich atomic clusters. Then, these methods anneal the cured insulator by exposing the cured insulator to microwave radiation in an inert (e.g., non-oxidizing) ambient atmosphere, at a temperature below 500° C., so as to increase the density of the cured insulator.

20 Claims, 9 Drawing Sheets

MICROWAVE ANNEALING OF FLOWABLE OXIDES WITH TRAP LAYERS

BACKGROUND

Field of the Invention

The present disclosure relates to integrated circuit structures and the manufacture thereof, and more specifically, to microwave annealing of flowable oxides with trap layers.

Description of Related Art

Integrated circuit devices use transistors for many different functions, and these transistors can take many different forms, from planar transistors, to vertical transistors, to transistors that use a "fin" style structure. Generally, transistor structures are formed by depositing or implanting impurities into a substrate or fin to form at least one semiconductor channel region, bordered by shallow trench isolation regions below the top (upper) surface of the substrate. A "substrate" can be any material appropriate for the given purpose (whether now known or developed in the future) and can be, for example, silicon-based wafers (bulk materials), ceramic materials, organic materials, oxide materials, nitride materials, etc., whether doped or undoped. Shallow trench isolation (STI) structures are generally formed by patterning openings/trenches and growing or filling the openings with a highly insulating material, this allows different active areas to be electrically isolated from one another.

Flowable oxides are often used for shallow trench isolation and interlayer dielectric (ILD) isolation structures. Flowable oxides are commonly formed in flowable chemical vapor deposition (FCVD) processing. This involves an initial conversion of the flowable insulator formed in the FCVD processing to $SiO_2$ in an oxidizing ambient such as steam, followed by a high temperature densification anneal (e.g., greater than 900° C.); however, such densification anneals may be incompatible with manufacturing flows that limit temperatures to less than 500° C., and manufacturing flows that perform oxidization.

Thus, such steam processing may be incompatible with materials such as SiGe, metals (e.g., work function metals) and materials that must be processed at lower temperatures, such as glass, ceramic, or organic substrates used for internet of things (IoT), flexible electronics such as silicon on insulator (SOI), etc. Additionally, aggressively scaled fin-type field effect transistors (FINFETs) with narrow fins (e.g., less than 10 nm wide) could be undesirably oxidized during steam annealing processes, necessitating the use of liners such as polysilicon and nitride that adversely impact the filling of gaps.

SUMMARY

Various methods herein form trenches in a substrate when producing integrated circuit devices, and deposit an insulator in the trenches by performing a flowable chemical vapor deposition (FCVD) process. Also, these methods cure the insulator by exposing the insulator to ultraviolet light while simultaneously flowing ozone over the insulator to produce a cured insulator. The curing process forms nitrogen, hydrogen, nitrogen monohydride, or hydroxyl-rich atomic clusters in the insulator (either in discrete layers, or uniformly, equally throughout the insulator).

These methods can also optionally form alternating high and low density insulator layers. In this process a second insulator (that is different from the insulator that is cured) is formed on the cured insulator. Then, the depositing and curing processes are repeated to form an additional cured insulator on the second insulator (and this cycle can be repeated to form multiple second insulator layers alternating with multiple cured insulator layers). The cured insulator and the additional cured insulator include the atomic clusters; however, the second insulator does not include the atomic clusters, which (after densification) forms alternating high and low density insulator layers.

Following the curing process (and possible formation of intervening second insulator layers), these methods select wavelengths of microwave radiation (that will be subsequently used during annealing) so that such wavelengths excite the nitrogen, hydrogen, nitrogen monohydride, or hydroxyl-rich atomic clusters. Then, these methods anneal the cured insulator by exposing the cured insulator to microwave radiation in an inert (e.g., non-oxidizing) ambient atmosphere, at a temperature below 500° C., so as to increase the density of the cured insulator. Subsequently, these methods remove portions of the cured insulator after the annealing, to leave the cured insulator only in the trenches.

The above methods produce various structures, including integrated circuit devices that include (among other components) a substrate having trenches therein, an insulator in the trenches, etc. The insulator is a cured flowable material, and the insulator includes atomic clusters that are reactive to microwave radiation. The atomic clusters include nitrogen, hydrogen, nitrogen monohydride, or hydroxyl-rich atomic clusters distributed evenly within the cured flowable material. Additionally, these structures include a channel region (e.g., SiGe) in the substrate between the trenches.

The insulator can include alternating layers of the cured flowable material and layers of a second insulator that is different from the cured flowable material. The layers of the cured flowable material include the atomic clusters, but the intervening layers of the second insulator do not include the atomic clusters.

BRIEF DESCRIPTION OF THE DRAWINGS

The embodiments herein will be better understood from the following detailed description with reference to the drawings, which are not necessarily drawn to scale and in which:

FIGS. 2-7B are cross-sectional schematic diagrams of integrated circuit structures produced according to embodiments herein;

DETAILED DESCRIPTION

As noted above, the annealing processes used for densification of flowable oxides can be incompatible with manufacturing flows that require temperatures to remain below a temperature limit (e.g., 500° C., etc.). In view of this, the methods and systems herein convert the flowable insulator formed in the flowable chemical vapor deposition (FCVD) processing to $SiO_2$ at temperatures below 500° C. (e.g., 250° C.-300° C.), without using an oxidizing steam anneal (and without affecting wet etch rates).

More specifically, the methods and systems herein reduce the temperature used for flowable oxide densification to below 500° C. by forming trap layers (e.g., nitrogen rich atomic clusters), and coupling later applied microwave energy to these trap layers. For example, such dielectrics are useful for STI and ILD applications, as well as middle of line (MOL) gap fill structures, where a non-oxidizing ambient is beneficial (in addition to a thermally restricted flow).

This disclosure presents methods and systems that form an (in situ) nitrogen rich trap layer using a simultaneous ultraviolet (UV) light exposure and ozone flow curing process. For example, in this processing, the ozone flow is provided during UV light exposure, and this creates the atomic clusters within the cured insulator layer (without using an oxidizing steam anneal). The atomic clusters are later used to couple microwave radiation into the flowable oxide film. Densification of flowable oxides is achieved with microwave annealing at anneal temperatures less than 500° C. (e.g., 250° C.-300° C.).

Further, wet etch rate profiles after this processing remain unaffected (e.g., are similar to wet etch profiles that result from an oxidizing steam anneal). For example, by coupling microwave energy into the atomic clusters formed by the in situ ultraviolet cure, a wet etch rate ratio below 4.0 can be achieved at a thermal budget of less than 500° C. Therefore, while this processing avoids using an oxidizing steam anneal, it still can obtain comparable wet etch rates that are typically obtained using an oxidizing ambient such as steam anneal.

Figure 1:
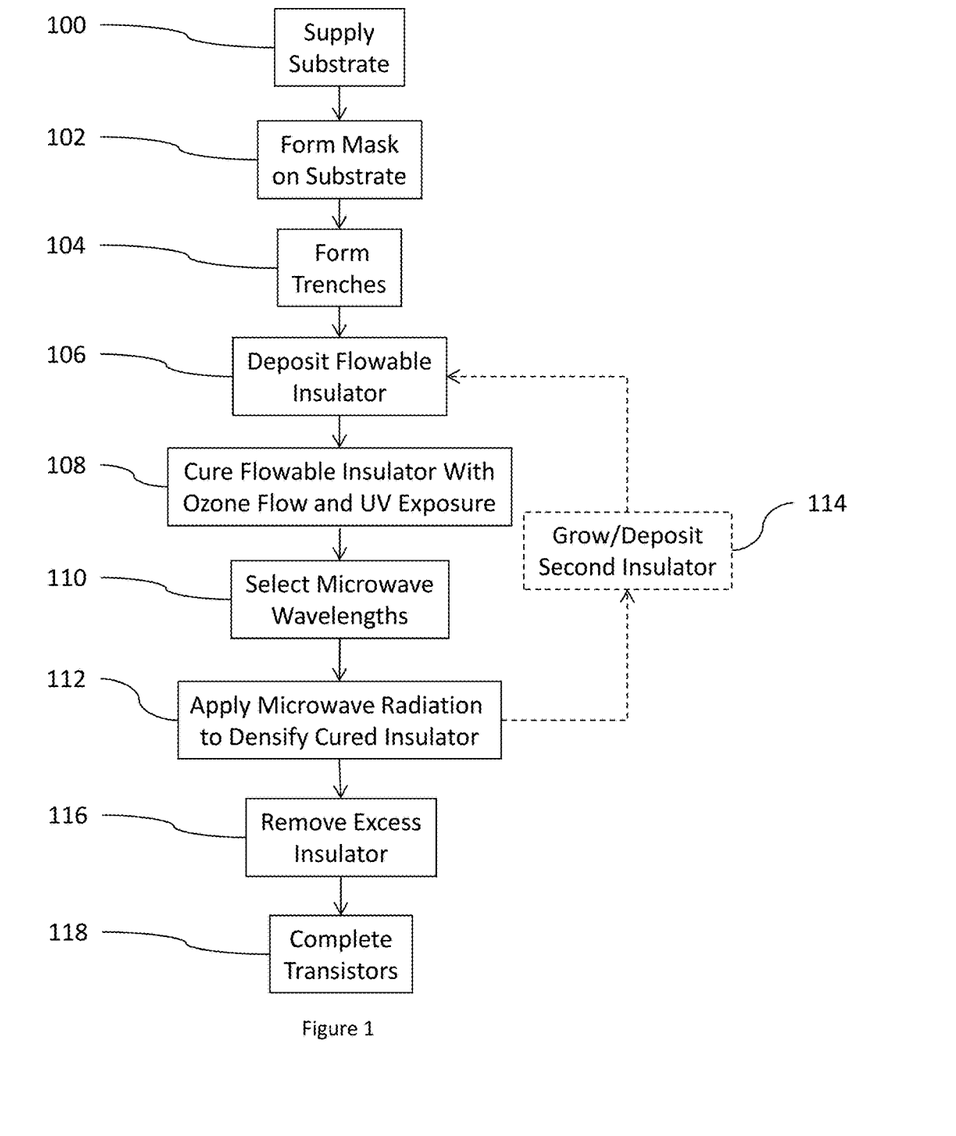
FIG. 1 is a flow diagram illustrating embodiments herein.

In greater detail, as shown in flowchart form in FIG. 1, a substrate (e.g., SiGe (or other) doped bulk wafer, ceramic substrate, organic substrate, etc.) is supplied in item 100, a photolithographic mask is formed on the substrate in item 102, and an etching process forms shallow trenches in item 104 (and these will be later filled with insulators to create shallow trench isolation structures). In item 106, a flowable insulator containing impurities is deposited (e.g., an insulator is flowed in a FCVD process). For example, in item 106, a flowable oxide can be created in a deposition using trisilylamine (TSA) and $NH_3$ reactants, and can therefore have nitrogen, hydrogen, etc., impurities.

Subsequently, in item 108, ozone ($O_3$) is supplied over the flowable oxide while ultraviolet radiation (e.g. light) is simultaneously applied, at a low temperature (e.g., 10-25° C.), to cure the flowable insulator layer. The presence of the ozone enables movement of impurities within the flowable oxide (that was previously deposited in item 106), and the UV energy causes the now movable impurities to cluster together into what is referred to herein as atomic clusters or traps. Therefore, this process can be controlled to produce nitrogen (N) rich traps, hydrogen (H) rich traps, hydroxyl (OH) rich traps, and/or nitrogen monohydride (NH) rich traps, depending upon which impurities are included within the FCVD layer (flowable insulator).

In one example, in item 108, ozone can be flowed over the flowable insulator at a rate between 5000 and 20000 sccm; while an ultraviolet light of 50-600 microwatts/cm$^2$ is directed toward (applied to) the flowable insulator. By doing this, the ozone enables movement of N, O, H, etc., atoms and the UV energy causes such atoms to cluster together. The clusters are located uniformly (distributed evenly everywhere) in the film. Therefore, as a result of the simultaneous UV light and ozone, the nitrogen, hydrogen, nitrogen monohydride, and/or hydroxyl atoms are stabilized into atomic clusters of nano-dots (the flowable insulator is cured/densified) after the ozone and UV light are removed.

In item 110, following the curing process in item 108, these methods select wavelengths and wattages of microwave radiation (that will be subsequently used during annealing) so that such microwaves excite and transfer energy (heat) to the atomic clusters of the impurities (nitrogen, hydrogen, nitrogen monohydride, and/or hydroxyl).

Next, as shown in item 112, microwave power (e.g., between 1 and 10 kW) is applied to the cured flowable insulator layer in a non-oxide (inert) gas atmosphere (lacking oxygen), which does not cause the flowable insulator to exceed 500° C. (and can be substantially less; e.g., 250° C.-300° C.). More specifically, the atomic clusters in the cured insulator absorb the microwave energy and this raises the temperature of the cured insulator, which reduces the thickness of the cured insulator, without removing the insulator, and this makes the cured insulator denser. Therefore, densification of the flowable insulator is achieved with microwave annealing, and not a steam oxide, at anneal temperatures less than 500° C. (e.g., 250° C.-300° C.) in a non-oxide (non-oxygen inert) gas atmosphere. This makes the methods and devices herein highly useful for devices that use materials that suffer from oxidization in steam oxide environments, and that suffer from defects resulting from melting that can be caused by high temperature anneals.

Further, multilayers of trap rich $SiO_2$ and trap free $SiO_2$ layers can be alternatively formed to create layers of high density and low density $SiO_2$. More specifically, such alternating layers containing the atomic clusters and layers lacking the atomic clusters are optionally formed (indicated by the dashed lines in item 114 in FIG. 1) by repeatedly looping back to item 106, through item 114, where a second, impurity free, insulator (e.g., $SiO_2$ etc.) is grown or deposited.

Note that the second insulator formed in item 114 does not contain the impurities of the flowable insulator formed in item 106, and therefore the insulator formed in item 114 will not form atomic clusters, and will not be made more dense during the application of microwave radiation in item 112. In other words, the second insulator will not be made denser during the subsequent application of microwave radiation because no atomic clusters are present to absorb the microwave energy that is needed to raise the temperature of the second insulator and make it more dense. Thus, this second insulator formed in item 114 is different than the flowable insulator deposited in item 106, and does not contain the N, O, H, etc., atoms; and, therefore, the UV energy applied in item 108 cannot grow atomic clusters in the lower density insulator. This will result in the second insulator having a lower density relative to the cured insulator. Each loop back through item 114 will cause an additional pair of alternating layers containing impurity rich traps, and layers lacking the impurity rich traps to form (and such layers will have different densities after the subsequent densification processing).

In item 116 a material removal process (e.g., wet etching/polishing) is performed to remove excess amounts of the densified insulator, and leave the densified insulator only within the trenches formed in item 104. The wet rate of the densified insulator is equivalent to the wet etch rate that would be seen with flowable insulators process through steam anneals. In item 118 the transistor structures are completed, as discussed below with respect to FIGS. 8A-12.

Figure 2:
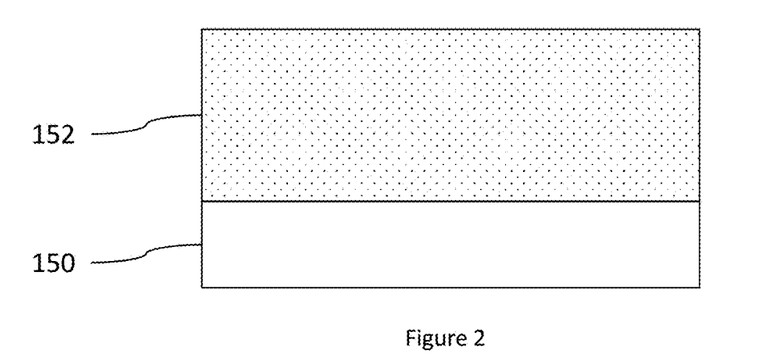
Figure 3:
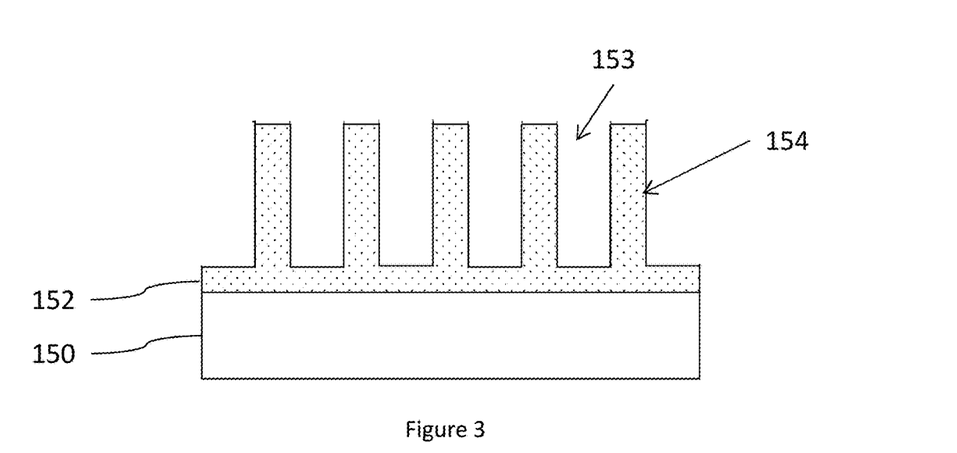

This is also shown in FIGS. 2-7B, which are cross-sectional views of an exemplary integrated circuit structure. In FIG. 2, a silicon layer 152 (e.g., SiGe) is formed on an optional substrate 150 (such as a silicon on insulator (SOI) substrate). In FIG. 3, trenches 153 are formed in the silicon layer 152 to pattern the silicon layer 152 into fins 154. Therefore, FIGS. 2 and 3 illustrate channel regions 152 that are formed as fins 154 (e.g., SiGe channels can be created in fins for fin-type field effect transistors (FinFETs). In addition, depending upon the type of transistor structure being produced, well implants can be made to create source/drain and other structures. Between the fins 154, the shallow trenches 153 will be later filled with insulators to create shallow trench isolation structures.

Figure 4:
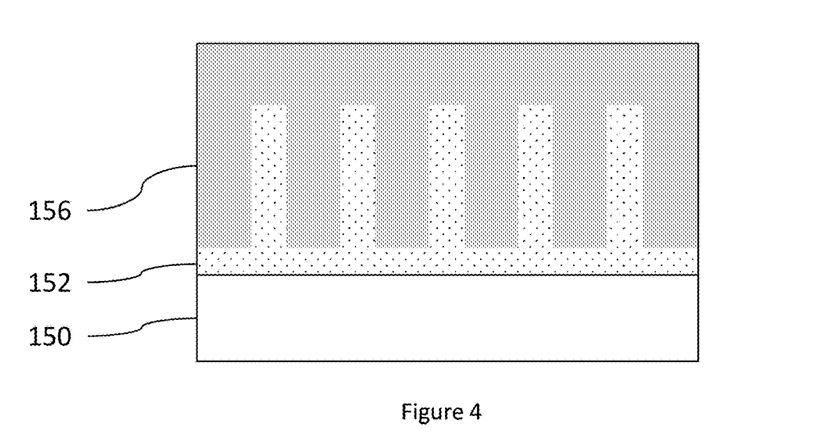

As shown in FIG. 4, a flowable insulator 156 containing impurities is deposited (e.g., an insulator is flowed in a FCVD process). For example, the flowable oxide 156 can be created in a deposition using trisilylamine (TSA) and $NH_3$ reactants.

Figure 5A:
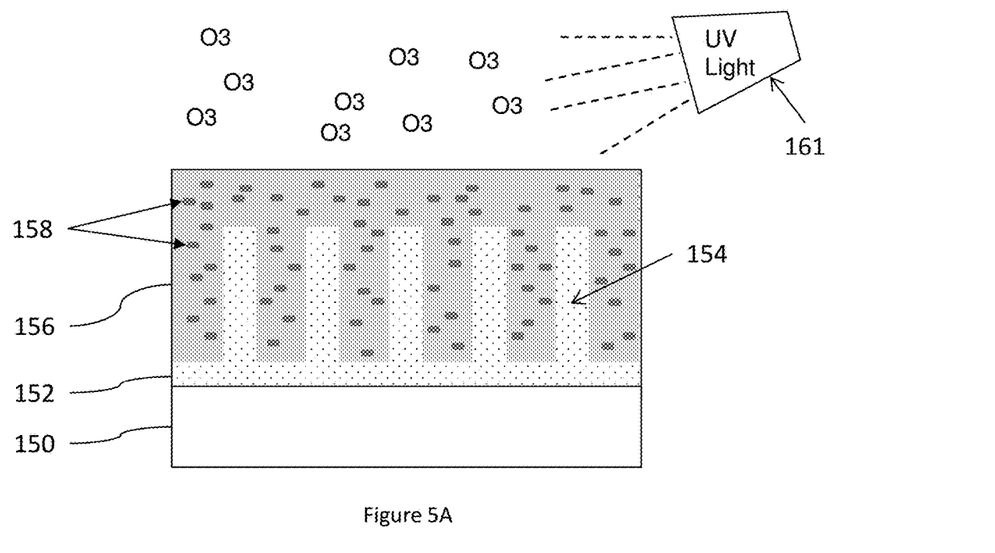
Figure 5B:
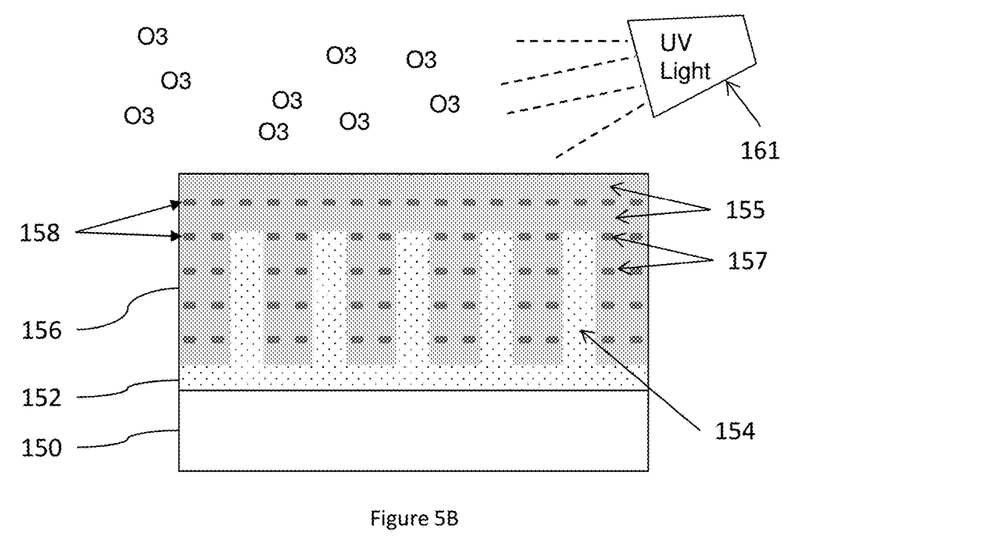

As shown in FIGS. 5A-5B, ozone flow and ultraviolet light 161 are simultaneously applied to the insulator 156 at a low temperature (e.g., 10-25° C.) to cure the insulator layer 156. This causes the impurity (e.g., N, H, OH, NH, etc.) rich traps 158 to be segregated and stabilized into clusters of nano-dots. Therefore, the N, H, OH, NH, etc., rich traps 158 are distributed continuously (as shown in FIG. 5A).

Further, as shown in FIG. 5B multilayers of trap rich $SiO_2$ layers 157 and trap free $SiO_2$ layers 155 can optionally be formed to create layers of high density and low density $SiO_2$. As described above, such alternating layers 157 containing N, H, OH, NH, etc., atomic clusters 158 and layers 155 lacking the N, H, OH, NH, etc., atomic clusters 158 are optionally formed by alternatively forming a lower density insulator (e.g., $SiO_2$ etc.) that is grown or deposited between each cycle of flowable insulator deposition and curing with ozone and UV light.

Figure 6A:
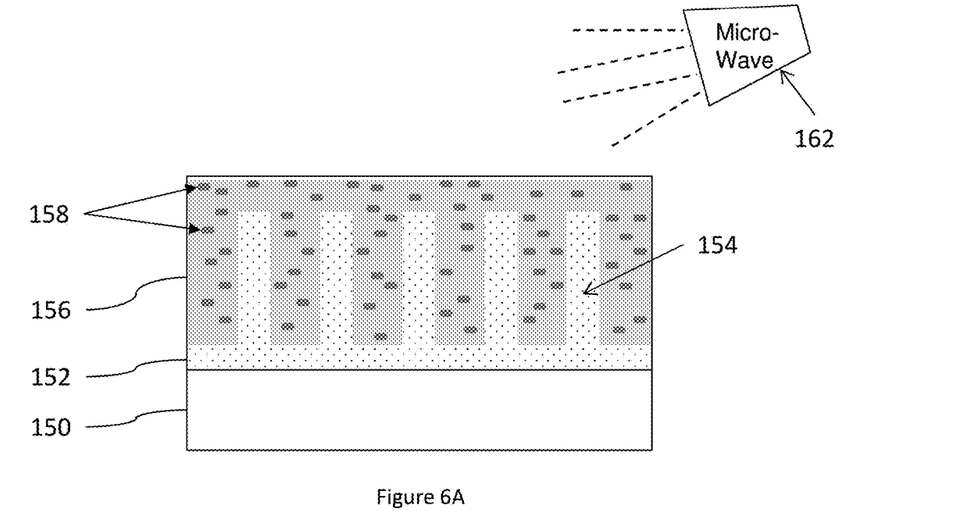
Figure 6B:
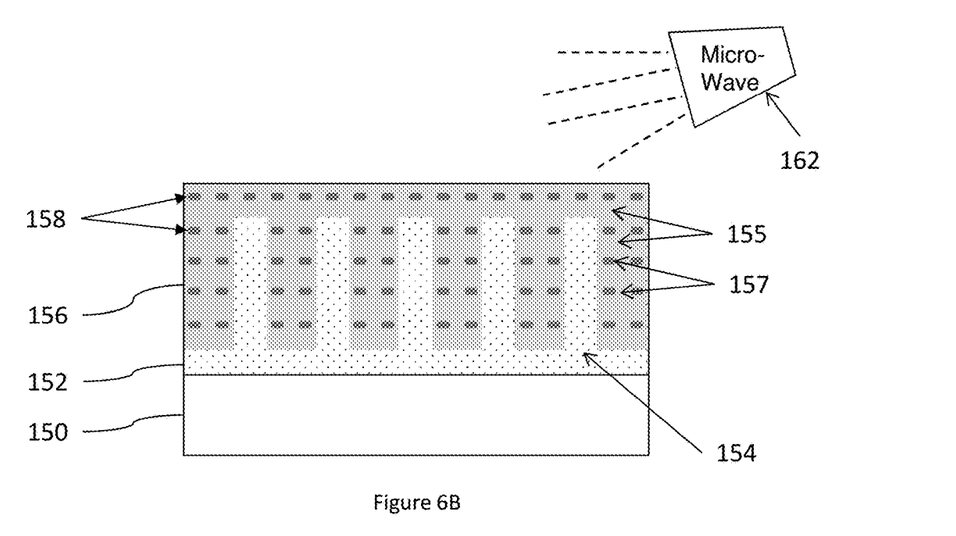

FIGS. 6A-6B similarly show the nitrogen rich traps 158 distributed continuously (FIG. 6A) and alternating layers 157 containing the atomic clusters 158 and layers 155 lacking the atomic clusters 158 (FIG. 6B). As noted above, the power of the microwave radiation is selected so that such microwaves excite the atomic clusters 158. FIGS. 6A-6B also show microwave radiation 162 that is applied to the cured flowable insulator layer 156. Therefore, densification of the flowable insulator 156 is achieved only with microwave annealing 162, in an inert ambient atmosphere at anneal temperatures less than 500° C. (e.g., 250° C.-300° C.), and without steam oxidization.

Note that, as shown in FIG. 6B, the layers 155 lacking N, H, OH, NH, etc., rich traps will not be made more dense during the application of microwave radiation. Again, the second insulator 155 is different than the flowable insulator 157 used to form the N, H, OH, NH, etc., rich traps, and does not contain the N, O, H, etc., atoms. Therefore, the UV energy cannot grow the N, H, OH, NH, etc., rich clusters in the second insulator 155. As a consequence, while the microwave energy increases the density of the cured insulator 157, the second insulator 155 will not be made more dense during the application of microwave radiation because no atomic clusters are present to absorb the microwave energy that is needed to raise the temperature of the second insulator 155 and make it more dense.

Figure 7A:
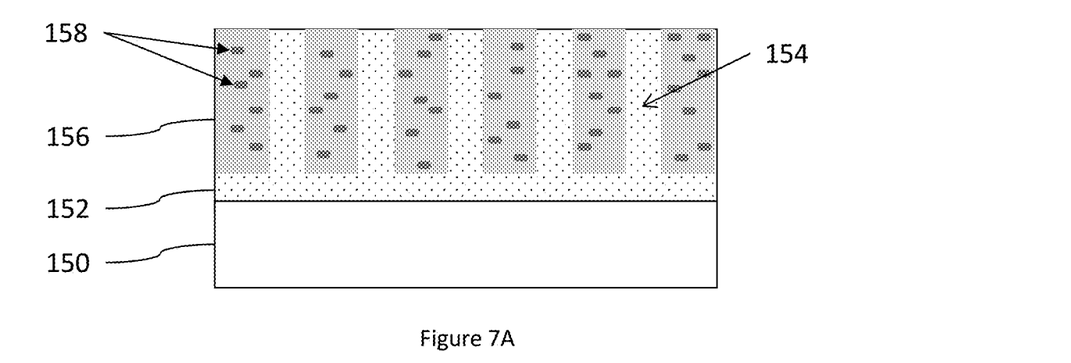
Figure 7B:
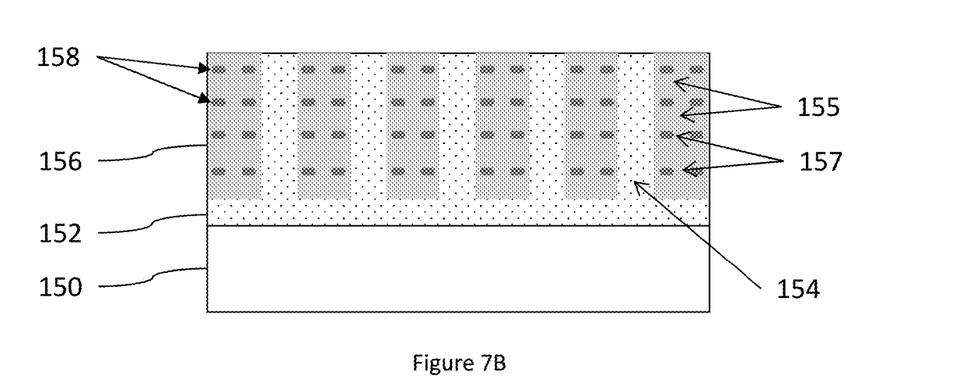

FIGS. 7A-7B similarly show the atomic clusters 158 distributed continuously (FIG. 7A) and alternating layers 157 containing the atomic clusters 158 and layers 155 lacking the atomic clusters 158 (FIG. 7B). FIGS. 7A-7B also show the result of a material removal process (e.g., wet etching/polishing, such as chemical-mechanical polishing (CMP) processing) that is performed to remove excess amounts of the densified insulator, and leave the densified insulator only within the trenches. The wet rate with the atomic clusters 158 and microwave annealing is equivalent to the wet etch rate that would be seen after steam anneal.

For simplification in the drawings, only N, H, OH, NH, etc., rich atomic clusters 158 distributed continuously are shown in the following structures; however, such structures shown in FIGS. 8A-12 could include the atomic clusters 158 distributed continuously, or in alternating layers 157; and layer 156 in the following Figures is intended to show both implementations.

Figure 8A:
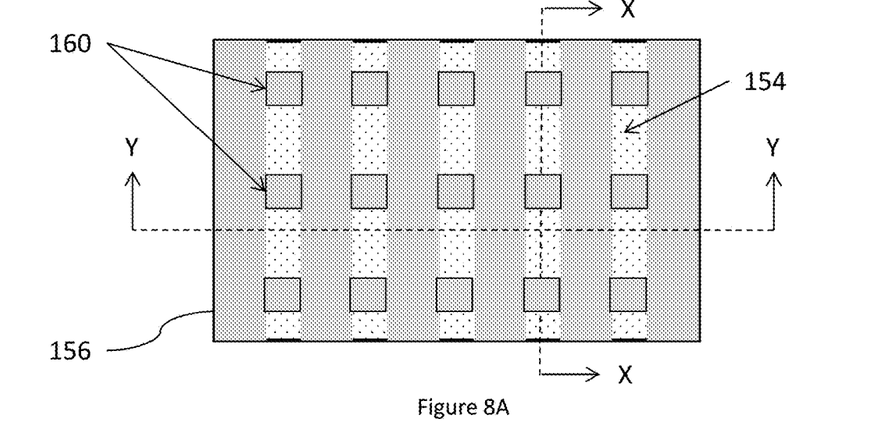
FIG. 8A is a top-view schematic diagram of integrated circuit structures produced according to embodiments herein.
Figure 8B:
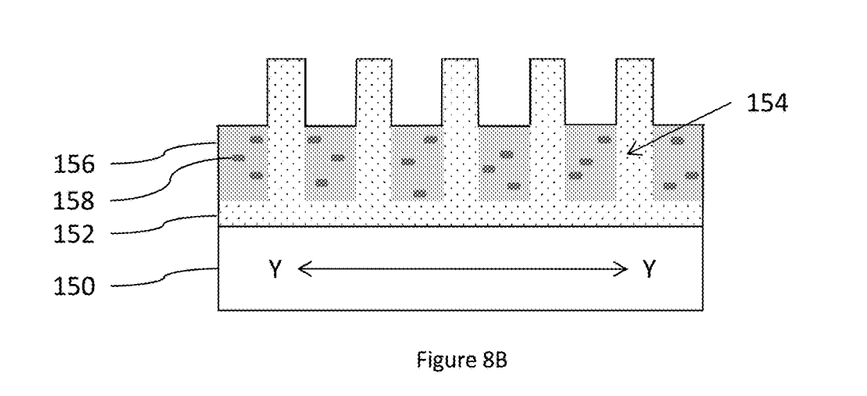
FIGS. 8B-8C are cross-sectional schematic diagrams of the integrated circuit structure shown in FIG. 8A.
Figure 8C:
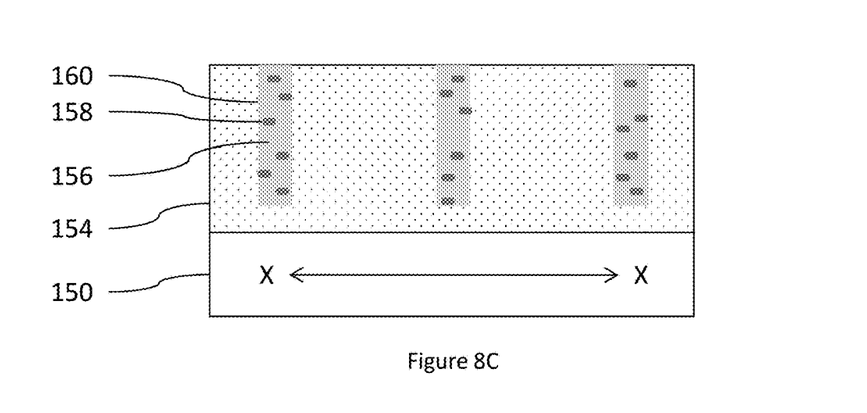

FIG. 8A is a top-view schematic diagram, FIG. 8B is a cross-sectional schematic diagram of the integrated circuit structure shown in FIG. 8A along line Y-Y (and is the same view shown in FIGS. 2-7B, discussed above), and FIG. 8C is a cross-sectional schematic diagram of the integrated circuit structure shown in FIG. 8A along line X-X. FIGS. 8A and 8B illustrates the multiple parallel semiconductor fins 154 within the insulator layer 156 containing the N, H, OH, NH, etc., rich atomic clusters 158, while FIG. 8C illustrates one of the fins 154. Additionally, FIGS. 8A and 8C illustrates that each of the fins 154 includes isolation regions 160 in which the insulator layer 156 has been formed.

FIG. 8B illustrates processing after a fin reveal has been performed. More specifically, various processing (oxide deglaze, nitride strip, SOH strip, nitride strip, etc.) is performed to remove a portion of the insulator layer 156 between the fins 154, but this processing leaves the insulator layer 156 in the isolation regions 160.

Figures 9A, 9B:
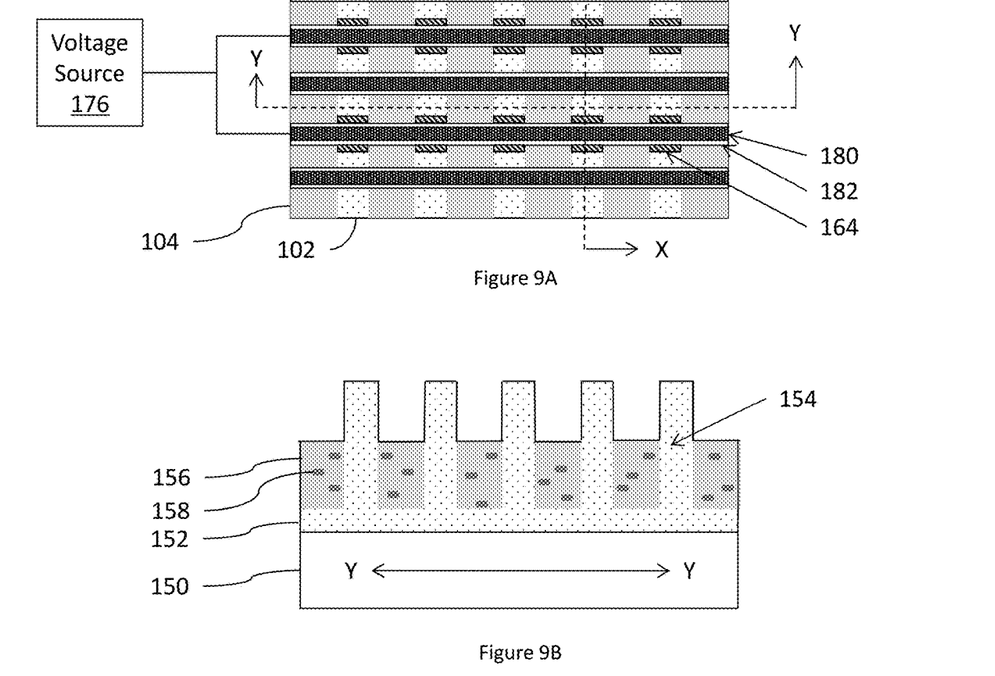
FIG. 9A is a top-view schematic diagram of integrated circuit structures produced according to embodiments herein.
FIGS. 9B-9C are cross-sectional schematic diagrams of the integrated circuit structure shown in FIG. 9A.

Similarly to FIGS. 8A-8C, FIG. 9A is a top-view schematic diagram, FIG. 9B is a cross-sectional schematic diagram of the integrated circuit structure shown in FIG. 9A along line Y-Y (and is the same view shown in FIGS. 2-7B, discussed above), and FIG. 9C is a cross-sectional schematic diagram of the integrated circuit structure shown in FIG. 9A along line X-X.

Figure 9C:
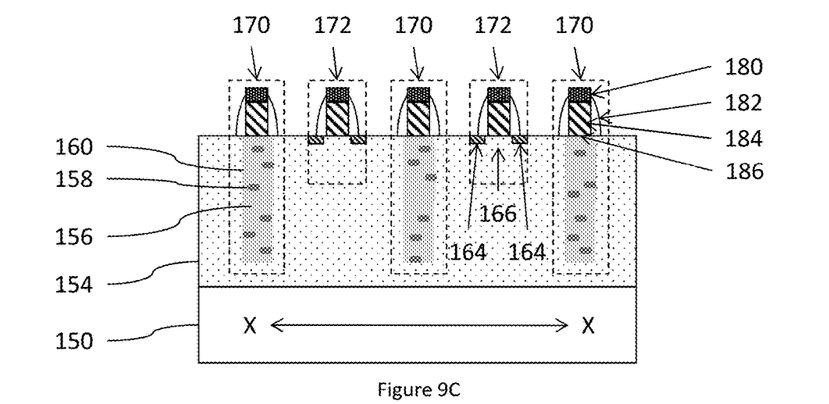

As shown in FIG. 9C, methods herein form gate stacks 180-186 contacting, and spaced along the top of each fin 154. Each of the gate stacks includes a hardmask cap (e.g., nitride) 180, connected to which is a gate conductor (metal, polysilicon, etc.) 184, and connected to that is a gate insulator (e.g., oxide) 186; and spacers 182 (e.g., nitride, oxide, etc.) on the sidewalls of the foregoing elements. Any conventional gate stack formation processing can be used, whether currently known, or developed in the future to form the gate stacks 180-186. Additional processing forms source and drain regions 164 in the fins 154 (potentially using the gate stack as a self-alignment aid).

The source and drain 164 regions, and the semiconductor portion of the fin 166 (channel region) that contacts some of such gate stacks 180-186, form functional transistors 172. In contrast, other gate stacks 180-186, and the insulator 156 containing the atomic clusters 158 in the isolation regions 160, form non-functional diffusion breaks 170 on opposite sides of the functional transistors 172. The non-functional transistors 170 are diffusion breaks that insulate functional transistors 172 from one another.

As shown in FIG. 9A, the conductive gate 180 of the functional transistors 172 are connectable to a voltage source 176; however, the conductive gates 184 of the non-functional diffusion breaks 170 are insulated from voltage source 176. These non-functional diffusion breaks 170 insulate the functional transistor 172 from other structures.

Figure 10:
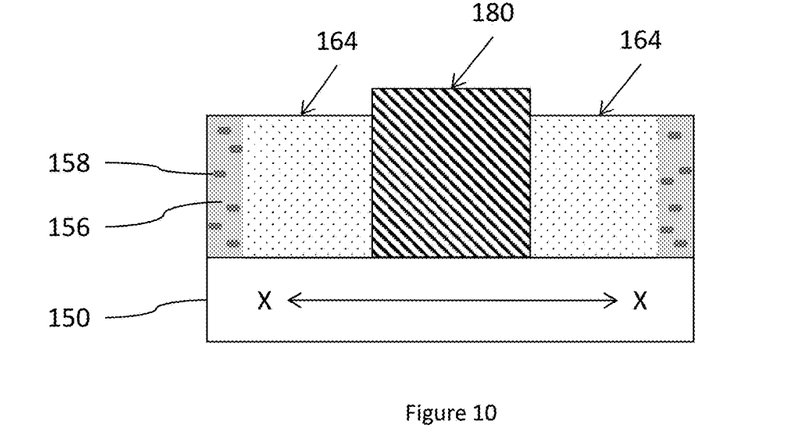
FIGS. 10-12 are cross-sectional schematic diagrams of integrated circuit structures produced according to embodiments herein.

FIG. 10 illustrates another type of fin-type transistor (FinFET) that includes full fin thickness doped source/drain regions 164 separating a full fin thickness channel region that is covered by a gate oxide and gate conductor 180, with isolation regions of the insulator 156 with the atomic clusters 158.

Figure 11:
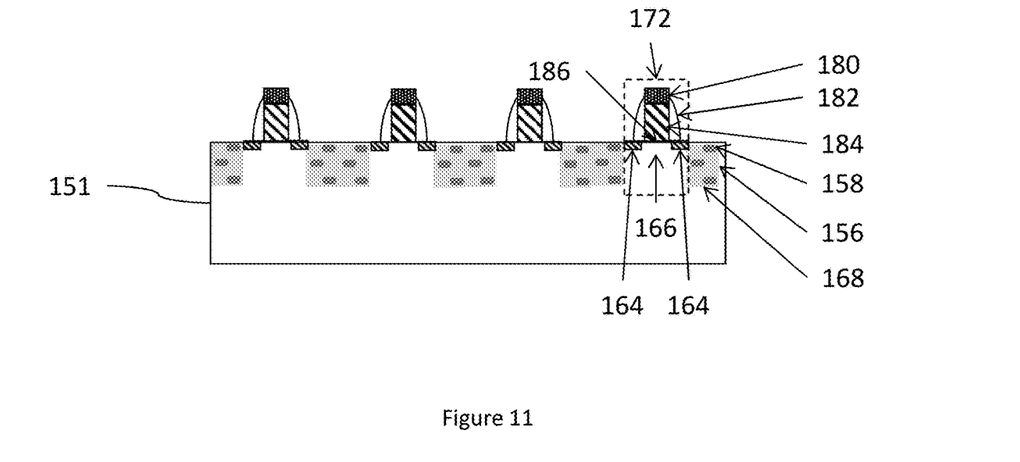

FIG. 11 illustrates a similar structure that includes planar transistors 172 (containing implanted source/drains 164, channel region 166, gate stack 180-186, etc.) electrically insulated from one another by the insulator 156 containing the atomic clusters 158 forming STI regions 168. The substrate 151 can be any substrate, including substrates that cannot tolerate temperatures in excess of 500° C., such as substrates used for internet of things (IoT), flexible electronics such as silicon on insulator (SOI), plastic, and glass substrates, etc.

Figure 12:
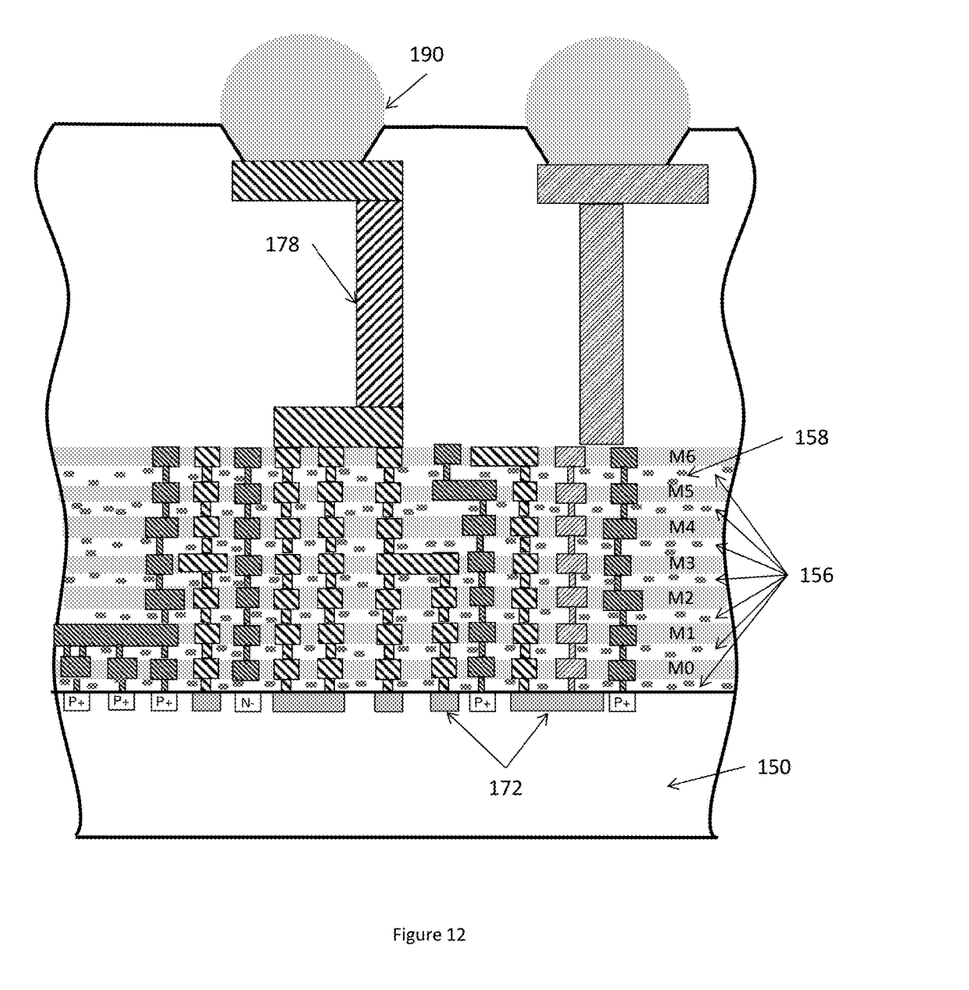

FIG. 12 illustrates that the insulator 156 containing the atomic clusters 158 can be used as an inter-layer dielectric (ILD) in any structure, such as middle-of-line (MOL) or back-end-of-line (BEOL) metallization layers M0-M6 that are formed to connect underlying transistors 172 to wiring 178 and exterior connections 190.

Therefore, such methods produce various integrated circuit structures as shown, for example, in FIGS. 8A-12 that include (among other components) a substrate 150 having trenches 153 therein, an insulator 156 in the trenches 153, etc. The insulator 156 is a cured flowable material, and the insulator 156 includes atomic clusters 158 that are reactive to (absorb energy from) microwave radiation. The atomic clusters 158 can be, for example, nitrogen, hydrogen, nitrogen monohydride, or hydroxyl-rich atomic clusters distributed evenly within the cured flowable material 156. Additionally, these structures include a channel region (e.g., SiGe) 166 in the substrate 150 between the trenches.

As noted above, the insulator 156 can include alternating layers 157 of the cured flowable material and layers 155 of a second insulator that is different from the cured flowable material 157. The cured insulator 157 includes the atomic clusters 158, but the second insulator 155 does not include the atomic clusters 158.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. Alternatively, the dielectrics herein may be formed from any of the many candidate high dielectric constant (high-k) materials, including but not limited to silicon nitride, silicon oxynitride, a gate dielectric stack of $SiO_2$ and $Si_3N_4$, and metal oxides like tantalum oxide. The thickness of dielectrics herein may vary contingent upon the required device performance.

Within transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments herein. The embodiments were chosen and described in order to best explain the principles of such, and the practical application, and to enable others of ordinary skill in the art to understand the various embodiments with various modifications as are suited to the particular use contemplated.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A method comprising:
    depositing an insulator by performing a flowable chemical vapor deposition (FCVD) process;
    curing the insulator by exposing the insulator to ultraviolet light while flowing ozone over the insulator to produce a cured insulator having atomic clusters reactive to microwave radiation; and
    annealing the cured insulator by exposing the cured insulator to microwave radiation in an inert ambient atmosphere.

2. The method according to claim 1, further comprising selecting wavelengths of the microwave radiation used during the annealing to excite the atomic clusters.

3. The method according to claim 1, further comprising:
    forming a second insulator different from the insulator on the cured insulator; and
    repeating the depositing and the curing to form an additional cured insulator on the second insulator,
    wherein the cured insulator and the additional cured insulator include the atomic clusters, and
    wherein the second insulator does not include the atomic clusters.

4. The method according to claim 1, wherein the curing forms nitrogen, hydrogen, nitrogen monohydride, or hydroxyl-rich atomic clusters.

5. The method according to claim 1, wherein the annealing is performed at a temperature below 500° C.

6. The method according to claim 1, wherein the annealing is performed in a non-oxidizing ambient atmosphere.

7. The method according to claim 1, wherein the annealing increases density of the cured insulator.

8. A method comprising:
    forming trenches in a substrate;
    depositing an insulator in the trenches by performing a flowable chemical vapor deposition (FCVD) process;
    curing the insulator by exposing the insulator to ultraviolet light while flowing ozone over the insulator to produce a cured insulator having atomic clusters reactive to microwave radiation;
    annealing the cured insulator by exposing the cured insulator to microwave radiation in an inert ambient atmosphere; and
    removing portions of the cured insulator after the annealing to leave the cured insulator only in the trenches.

9. The method according to claim 8, further comprising selecting wavelengths of the microwave radiation used during the annealing to excite the atomic clusters.

10. The method according to claim 8, further comprising:
    forming a second insulator different from the insulator on the cured insulator; and
    repeating the depositing and the curing to form an additional cured insulator on the second insulator,
    wherein the cured insulator and the additional cured insulator include the atomic clusters, and
    wherein the second insulator does not include the atomic clusters.

11. The method according to claim 8, wherein the curing forms nitrogen, hydrogen, nitrogen monohydride, or hydroxyl-rich atomic clusters.

12. The method according to claim 8, wherein the annealing is performed at a temperature below 500° C.

13. The method according to claim 8, wherein the annealing is performed in a non-oxidizing ambient atmosphere.

14. The method according to claim 8, wherein the annealing increases density of the cured insulator.

15. An integrated circuit structure comprising:
    a substrate;
    trenches in the substrate; and
    an insulator in the trenches,
    wherein the insulator comprises a cured flowable material, and
    wherein the insulator includes atomic clusters that are reactive to microwave radiation.

16. The integrated circuit structure according to claim 15, wherein the atomic clusters comprise nitrogen, hydrogen, nitrogen monohydride, or hydroxyl-rich atomic clusters.

17. The integrated circuit structure according to claim 15, wherein the insulator includes alternating layers of the cured flowable material and layers of a second insulator that is different from the cured flowable material, wherein the cured flowable material includes the atomic clusters, and wherein the second insulator does not include the atomic clusters.

18. The integrated circuit structure according to claim 15, wherein the atomic clusters are distributed evenly within the cured flowable material.

19. The integrated circuit structure according to claim 15, further comprising channel region in the substrate between the trenches.

20. The integrated circuit structure according to claim 19, wherein the channel region comprises SiGe.

* * * * *